US009034685B2

(12) United States Patent
Kimball et al.

(10) Patent No.: US 9,034,685 B2
(45) Date of Patent: May 19, 2015

(54) METHODOLOGY FOR FORMING PNICTIDE COMPOSITIONS SUITABLE FOR USE IN MICROELECTRONIC DEVICES

(75) Inventors: Gregory M. Kimball, Campbell, CA (US); Jeffrey P. Bosco, Pasadena, CA (US); Harry A. Atwater, South Pasadena, CA (US); Nathan S. Lewis, La Canada, CA (US); Marty W. Degroot, Middletown, DE (US); James C. Stevens, Richmond, TX (US)

(73) Assignees: Dow Global Technologies LLC, Midland, MI (US); California Institute of Technology, Pasadena, CA (US)

( * ) Notice: Subject to any disclaimer, the term of this patent is extended or adjusted under 35 U.S.C. 154(b) by 27 days.

(21) Appl. No.: 13/984,765

(22) PCT Filed: Feb. 10, 2012

(86) PCT No.: PCT/US2012/024670
§ 371 (c)(1), (2), (4) Date: Aug. 9, 2013

(87) PCT Pub. No.: WO2012/109549
PCT Pub. Date: Aug. 16, 2012

(65) Prior Publication Data
US 2013/0323877 A1     Dec. 5, 2013

Related U.S. Application Data

(60) Provisional application No. 61/441,997, filed on Feb. 11, 2011.

(51) Int. Cl.
*H01L 21/00* (2006.01)
*H01L 31/18* (2006.01)
(Continued)

(52) U.S. Cl.
CPC ............... *H01L 31/18* (2013.01); *C30B 23/02* (2013.01); *C30B 29/40* (2013.01);
(Continued)

(58) Field of Classification Search
USPC ............... 257/13, 86–90; 438/29, 57, 93; 118/712, 726
See application file for complete search history.

(56) References Cited

U.S. PATENT DOCUMENTS

| 3,751,310 A | 8/1973 | Cho |
| 4,325,986 A | 4/1982 | Baron et al. |

(Continued)

FOREIGN PATENT DOCUMENTS

| JP | 9-272774 | 10/1997 |
| WO | WO 2009/079777 | 7/2009 |

OTHER PUBLICATIONS

Fagen, "Optical Properties of $Zn_3P_2$" J. Appl. Phys. 50(10), pp. 6505-6515, Oct. 1979.

(Continued)

*Primary Examiner* — Mark A Laurenzi
(74) *Attorney, Agent, or Firm* — Kagan Binder, PLLC

(57) ABSTRACT

The present invention provides methods for making pnictide compositions, particularly photoactive and/or semiconductive pnictides. In many embodiments, these compositions are in the form of thin films grown on a wide range of suitable substrates to be incorporated into a wide range of microelectronic devices, including photovoltaic devices, photodetectors, light emitting diodes, betavoltaic devices, thermoelectric devices, transistors, other optoelectronic devices, and the like. As an overview, the present invention prepares these compositions from suitable source compounds in which a vapor flux is derived from a source compound in a first processing zone, the vapor flux is treated in a second processing zone distinct from the first processing zone, and then the treated vapor flux, optionally in combination with one or more other ingredients, is used to grow pnictide films on a suitable substrate.

20 Claims, 9 Drawing Sheets

(51) Int. Cl.

| | | |
|---|---|---|
| *C30B 23/02* | (2006.01) | |
| *C30B 29/40* | (2006.01) | |
| *H01L 21/02* | (2006.01) | |
| *H01L 31/032* | (2006.01) | |
| *H01L 31/0392* | (2006.01) | |
| *H01L 31/068* | (2012.01) | |
| *H01L 31/075* | (2012.01) | |

(52) U.S. Cl.
CPC ... *H01L 21/02395* (2013.01); *H01L 21/02409* (2013.01); *H01L 21/02538* (2013.01); *H01L 21/02568* (2013.01); *H01L 21/02573* (2013.01); *H01L 21/0262* (2013.01); *H01L 21/02631* (2013.01); *H01L 31/0321* (2013.01); *H01L 31/0392* (2013.01); *H01L 31/068* (2013.01); *H01L 31/075* (2013.01)

(56) References Cited

U.S. PATENT DOCUMENTS

| | | |
|---|---|---|
| 4,342,879 A | 8/1982 | Catalano et al. |
| 4,477,688 A | 10/1984 | Barnett et al. |
| 5,714,008 A | 2/1998 | Lee et al. |
| 6,162,300 A | 12/2000 | Bichrt |
| 2005/0229856 A1 | 10/2005 | Malik |
| 2006/0112985 A1 | 6/2006 | Hantschel et al. |

OTHER PUBLICATIONS

Covers et al., "Spectral response measurements of minority-carrier diffusion length in $Zn_3P_2$" J. Appl. Phys. 50(3), pp. 1403-1407, Mar. 1979.

Catalano et al., "Defect Dominated Conductivity in $Zn_3P_2$" J. Phys. Chem. Solids, vol. 41, pp. 635-640, 1980.

Wang et al., "Transport mechanisms for $Mg/Zn_3P_2$ Junctions" J. Appl. Phys. 53(12), pp. 8874-8879, Dec. 1982.

Turner et al., "Photoelectrochemical Investigation of $Zn_3P_2$" J. Electrochem. Soc., vol. 133, No. 3, pp. 536-539, Mar. 1986.

Bhushan et al., "Polycrystalline $Zn_3P_2$ Schottky barrier solar cells" Appl. Phys. Lett. 38,(1), pp. 39-31, Jan. 1, 1981.

Suda et al., "N-type zinc phosphide grown by molecular beam epitaxy" Appl. Phys. Lett. 69(16), pp. 2426-2428, Oct. 14, 1996.

Schlesinger, "The Thermodynamic Properties of Phosphorus and Solid Binary Phosphides" Chem. Rev., vol. 102, pp. 42674301, 2002.

Johnson et al., "Phosphorus cracking efficiency and flux transients from a valved effusion cell" J. Appl. Phys. 78(3), pp. 1664-1668, Aug. 1, 1995.

I P McClean et al., "Photoluminescence study of MBE-grown films of ZnS" Semicond. Sci. Technol. 7, pp. 1394-1399, 1992.

T. Suda and K. Kakishita, "Epitaxial Growth of Zinc Phosphide," J. Appl. Phys. 71(6), Mar. 15, 1992.

Foxton et al., "The Evaporation of GaAs Under Equilibrium and Non-Equilibrium Conditions Using a Modulated Beam Technique," J. Phys. Chem. Solids, vol. 34, pp. 1693-1701, 1973.

METHODOLOGY FOR FORMING PNICTIDE COMPOSITIONS SUITABLE FOR USE IN MICROELECTRONIC DEVICES

PRIORITY

This application claims the benefit from International No. PCT/US2012/024670, which was granted an International filing date of Feb. 10, 2012, which in turn claims priority from United States Provisional patent application having Ser. No. 61/441,997, filed on Feb. 11, 2011, by Kimball et al. and entitled METHODOLGY FOR FORMING PNICTIDE COMPOSITIONS SUITABLE FOR USE IN MICROELECTRONIC DEVICES, which applications are incorporated herein by reference in their entireties.

FIELD OF THE INVENTION

The present invention relates to methods of forming pnictide compositions suitable for use in microelectronic devices. More specifically, the vapor flux used to form the pnictide compositions is derived from pnictide source compounds, and the vapor flux is at least partially decomposed for use to grow pnictide films. The generation of the vapor flux and the decomposition of the flux occur at least partially in separate processing zones.

BACKGROUND OF THE INVENTION

Zinc phosphide ($Zn_3P_2$) and similar Group IIB/VA semiconductor materials have significant potential as photoactive absorbers in thin film photovoltaic devices. Zinc phosphide, for example, has a reported direct band gap of 1.5 eV, high light absorbance in the visible region (e.g., greater than $10^4$ to $10^5$ $cm^{-1}$), and long minority carrier diffusion lengths (about 5 to about 10 μm). This would permit high current collection efficiency. Also, materials such as Zn and P are abundant and low cost.

Zinc phosphide is known to be either p-type or n-type. To date, it has been much easier to fabricate p-type zinc phosphide. Preparing n-type zinc phosphide, particularly using methodologies suitable for the industrial scale, remains challenging. This has confounded the fabrication of p-n homojunctions based upon zinc phosphide. Consequently, solar cells using zinc phosphide most commonly are constructed with Mg Schottky contacts or p/n heterojunctions. Exemplary photovoltaic devices include those incorporating Schottky contacts based upon p-$Zn_3P_2$/Mg and have exhibited about 5.9% efficiency for solar energy conversion. The efficiency of such diodes theoretically limits open circuit voltage to about 0.5 volts due to the about 0.8 eV barrier height obtained for junctions comprising $Zn_3P_2$ and metals such as Mg.

Improved efficiency and open circuit voltage would be expected, though, from p/n homojunction cells for which the junction is formed by contiguous regions of the same semiconductor material having p and n type conductivity, respectively. One exemplary advantage of a p/n homojunction would be a minimization of discontinuity in the energy band structure while the gross composition remains the same. Also, indices of refraction of the adjacent p/n material would match, minimizing reflection losses. Also, the coefficients of thermal expansion would be matched to minimize potential delamination risks.

Some investigators have suggested that a p/n homojunction can form in situ when a layer of p-type zinc phosphide is heated while in contact with magnesium. See, e.g., U.S. Pat. No. 4,342,879. Other investigators have prepared n-type zinc phosphide using molecular beam epitaxy. Other approaches to make n-type zinc phosphide also have been attempted. However, such approaches generally yield devices with poor photovoltaic behavior, if any, due at least in part to poor film quality, lack of control over film stoichiometry, and/or lack of control over formation of high quality p/n junctions.

Strategies for improving the quality and electronic performance of microelectronic devices incorporating Group IIB/VA semiconductors or other pnictide compositions are strongly desired.

SUMMARY OF THE INVENTION

The present invention provides methods for making pnictide compositions, particularly photoactive and/or semiconductive pnictides. In many embodiments, these compositions are in the form of thin films grown on a wide range of suitable substrates to be incorporated into a wide range of microelectronic devices, including photovoltaic devices, photodetectors, light emitting diodes, betavoltaic devices, thermoelectric devices, transistors, other optoelectronic devices, and the like. As an overview, the present invention prepares these compositions from suitable source compounds in which a vapor flux is derived from a source compound in a first processing zone, the vapor flux is treated in a second processing zone distinct from the first processing zone, and then the treated vapor flux, optionally in combination with one or more other ingredients, is used to grow pnictide films on a suitable substrate.

The present invention offers many advantages. The method allows excellent control over growth rate and composition of the resulting thin films. Composition characteristics can be controlled on demand to grow uniform, single layer films. Alternatively, films can be made from multiple sublayers with differing compositions, optionally with p-type or n-type characteristics as desired. Single or multilayer stacks may be grown using one or more ingredient(s) including at least one single source compound in a single chamber as composition can be controlled in many embodiments by appropriate processing of the vapor flux rather than of the source compound. Thus, in some modes of practice, one can create all or a portion of a junction from the same source compound in a single process chamber using strategies described herein.

Composition characteristics can also be controlled via process control strategies in order to help ensure that films are grown in a manner that meets composition objectives. Deriving pnictogen content from one or more compound sources greatly enhances the safety of using deposition strategies to grow pnictogen-containing films for microelectronic applications. The techniques allow more efficient use of pnictogen so that more pnictogen ends up in the desired film rather than as by-product. The methods also allow higher temperatures to be used more easily and effectively for metal and pnictogen delivery to the growing film.

In one aspect, the present invention relates to a method of forming a pnictide composition, comprising the steps of:
  (a) providing at least one pnictide source compound, said pnictide source compound incorporating at least one pnictogen and at least one element other than a pnictogen;
  (b) treating the pnictide source compound under first conditions in a first processing zone in a manner effective to create a vapor flux derived at least in part from the pnictide source compound;
  (c) treating the vapor flux under second conditions in a second processing zone in a manner effective to, decompose at least a portion of the vapor flux; and (d) using ingredients including at least the treated vapor flux to form the pnictide composition.

In another aspect, the present invention relates to a method of forming a pnictogen-containing semiconductor, comprising the steps of:
   a) providing information indicative of how a composition of a semiconductor film is a function of at least temperature conditions used to decompose a vapor flux that is used to form the semiconductor film, said vapor flux being derived from at least a source compound including at least one pnictogen and at least one element other than a pnictogen; and
   b) using the information to select decomposition conditions;
   c) providing a vapor flux derived at least in part from the source compound;
   d) using the decomposition conditions to treat the vapor flux; and
   e) using at least the treated vapor flux to form at least a portion of the semiconductor.

In another aspect, the present invention relates to a method of forming multilayer structure, comprising the steps of:
   a) providing a pnictide source compound;
   b) treating the source compound in a first processing zone under first conditions effective to generate a vapor flux derived at least in part from the source compound;
   c) treating the vapor flux in a second processing zone under second conditions effective to decompose at least a portion of at least one vapor species included in the vapor flux;
   d) using at least the thermally treated vapor flux resulting from the second processing conditions to form a first pnictide film;
   e) treating the vapor flux in a processing zone different than the first processing zone under third conditions effective to decompose at least a portion of at least one vapor species included in the vapor flux such that the treated vapor flux resulting from the third conditions has a different composition relative to the composition of the vapor flux resulting from the second conditions; and
   f) using at least the treated vapor resulting from the third conditions to form a second pnictide film directly or indirectly overlying the first pnictide film.

In another aspect, the present invention relates to a method of forming a semiconductor comprising Zn and P, comprising the steps of:
   a) providing a source compound that includes at least Zn and P;
   b) thermally treating the compound in a first heating zone under conditions effective to create a vapor flux including P4 and at least one vapor species including at least Zn;
   c) thermally treating the vapor flux in a second heating zone under conditions effective to thermally decompose at least a portion of the P4; and
   d) using at least the thermally treated vapor flux to form the semiconductor.

In another aspect, the present invention relates to an apparatus suitable to form a pnictogen-containing semiconductor, comprising:
   a) a first heating zone in which a pnictide source compound is positioned and heatable under conditions effective to generate a vapor flux derived at least in part from the source compound;
   b) a pathway extending from the first heating zone to a substrate surface on which the vapor flux is deposited under conditions effective to form the semiconductor, said pathway including a second, independent heating zone in which the vapor flux is at least partially decomposed.

In another aspect, the present invention relates to a method of forming a photovoltaically active device or precursor thereof comprising the steps of
   a) providing a substrate;
   b) providing a first semiconductor region on the substrate, said first semiconductor region comprising at least one pnictogen and at least one metal;
   c) providing a second semiconductor region directly or indirectly on the first semiconductor region, wherein the second semiconductor region comprises at least one metal and at least one pnictogen; and wherein at least one of the first and second semiconductor regions is derived from a vapor flux derived at least in part from a pnictide source compound, said vapor flux being derived at least in part from the source compound in a first heating zone and said vapor flux being at least partially decomposed in a second, independent heating zone.

In another aspect, the present invention relates to a method of controlling the composition of a film comprising at least one metal and at least one pnictogen, said method comprising the steps of:
   a) providing a pnictide source compound;
   b) heating the source compound in a first heating zone under first conditions effective to generate a vapor flux obtained at least in part from the source compound;
   c) heating the vapor flux in a second heating zone under second conditions effective to decompose at least a portion of the vapor flux; wherein the second conditions are selected using at least information indicative of how the relative amount of the metal and the pnictogen in the film varies as a function of at least a temperature characteristic associated with the second conditions.

DETAILED DESCRIPTION OF PRESENTLY PREFERRED EMBODIMENTS

Figure 1:
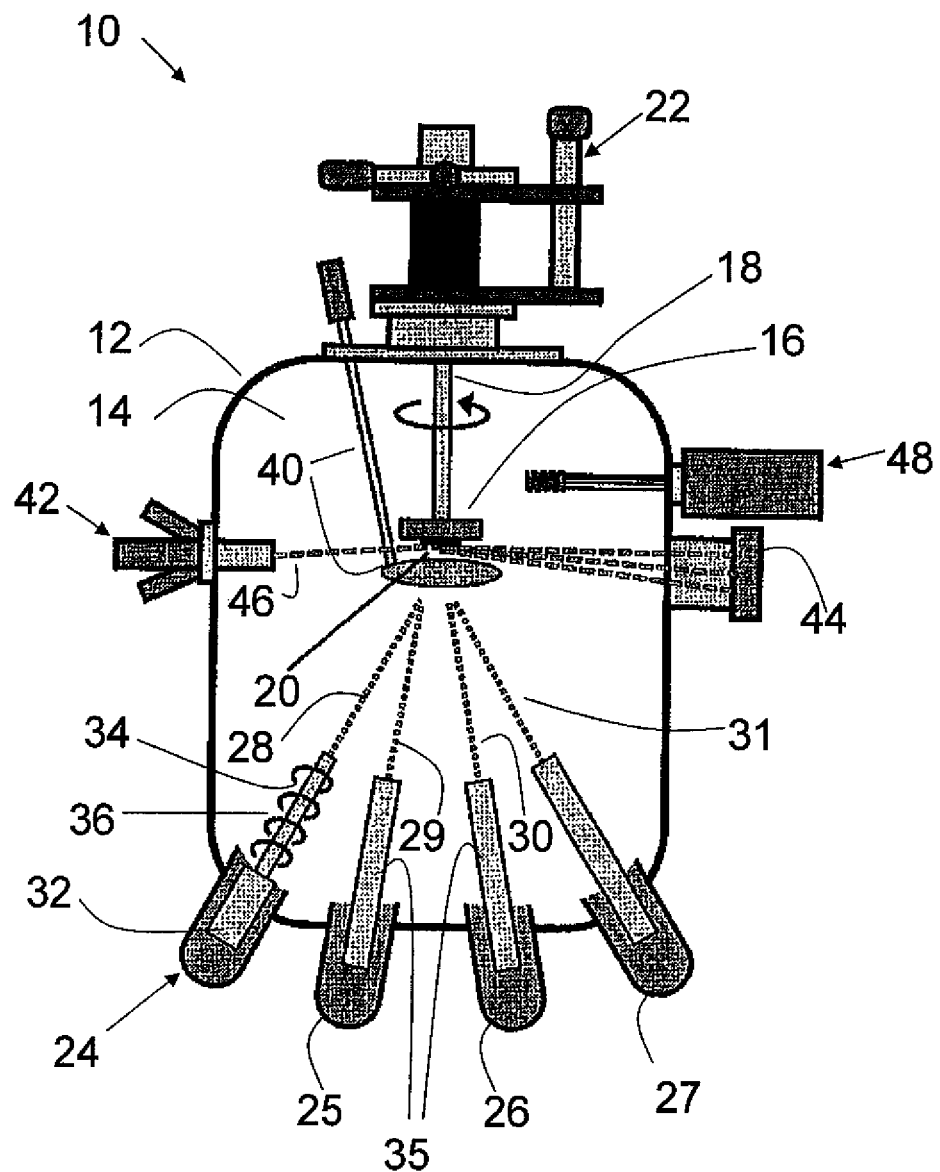
FIG. 1 is a schematic illustration of one kind of apparatus suitable for use in the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

The term "pnictogen" refers to any element from Group VA of the periodic table of elements. These also are referred to as Group VA or Group 15 elements. Pnictogens include nitrogen, phosphorus, arsenic, antimony, and bismuth. Phosphorus and arsenic are preferred. Phosphorus is most preferred.

The term "molecular pnictogen" refers to molecules that are formed only from one or more pnictogens. These generally may be represented by the formula $$P^N_z$$

wherein $P^N$ represents one or more pnictogens and the subscript z is in the range from 2 to about 8. Molecular pnictogens for which z is 2 or 4 tend to be most predominant in the practice of the present invention. Examples include $P_2$, $P_4$, $As_2$, $As_4$, $Sb_2$, $Sb_4$, PAs, PSb, AsAb, $As_e$, $P_2Sb_2$, $As_2Sb_2$, $P_2AsSb$, $PAs_2Sb$, $PAs_3$, $PAsSb_2$, combinations of these, and the like.

The term "pnictide" or "pnictide compound" refers to a molecule that includes at least one pnictogen and at least one element other than a pnictogen. These other elements may be metals, and/or nonmetals. In some embodiments, nonmetals may include one or more semiconductors. Examples of suitable metals and/or semiconductors include Si, the transition metals, Group IIB metals (Zn, Cd, Hg), metals included in the lanthanoid series, Al, Ga, In, Tl, Sn, Pb, combinations of these, and the like. In addition to the semiconductor materials noted above, other examples of such nonmetals include B, S, Se, Te, C, O, combinations of these, and the like. Examples of nonmetal pnictides include boron phosphide, boron nitride, boron arsenide, boron antimonide, combinations of these and the like. Pnictides that include both metal and nonmetal constituents in addition to one or more pnictogens are referred to herein as mixed pnictides. Examples of mixed pnictides include (a) at least one of Zn and/or Cd, (b) at least one of P, As, and/or Sb, and (c) at least one of Se and/or S, combinations of these, and the like.

Many embodiments of metal, non-metal, and mixed pnictides are photovoltaically active and/or display semiconductor characteristics. Examples of such photovoltaically active and/or semiconducting pnictides include phosphide, nitrides, antimonides, and/or arsenides of one or more of aluminum, boron, cadmium, gallium, indium, magnesium, germanium, tin, silicon, and/or zinc. Illustrative examples of such compounds include zinc phosphide, zinc antimonide, zinc arsenide, aluminum antimonide, aluminum arsenide, aluminum phosphide, boron antimonide, boron arsenide, boron phosphide, gallium antimonide, gallium arsenide, gallium phosphide, indium antimonide, indium arsenide, indium phosphide, aluminum gallium antimonide, aluminum gallium arsenide, aluminum gallium phosphide, aluminum indium antimonide, aluminum indium arsenide, aluminum indium phosphide, indium gallium antimonide, indium gallium arsenide, indium gallium phosphide, magnesium antimonide, magnesium arsenide, magnesium phosphide, cadmium antimonide, cadmium arsenide, cadmium phosphide, combinations of these and the like. Specific examples of these include $Zn_3P_2$; $ZnP_2$; $ZnAr_2$; $ZnSb_2$; $ZnP_4$; ZnP; combinations of these and the like.

Preferred embodiments of pnictide compositions comprise at least one Group IIB/VA semiconductor. A Group IIB/VA semiconductor generally includes (a) at least one Group IIB element and (b) at least one Group VA element. Examples of IIB elements include Zn and/or Cd. Zn is presently preferred. Examples of Group VA elements (also referred to as pnictogens) include one or more pnictogens. Phosphorous is presently preferred.

Exemplary embodiments of Group IIB/VA semiconductors include zinc phosphide ($Zn_3P_2$), zinc arsenide ($Zn_3As_2$), zinc antimonide ($Zn_3Sb_2$), cadmium phosphide ($Cd_3P_2$), cadmium arsenide ($Cd_3As_2$), cadmium antimonide ($Cd_3Sb_2$), combinations of these, and the like. Group IIB/VA semiconductors including a combination of Group IIB species and/or a combination of Group VA species (e.g., $Cd_xZn_yP_2$, wherein each x and y is independently about 0.001 to about 2.999 and x+y is 3) also may be used. In an illustrative embodiment, the Group IIB/VA semiconductor material comprises p-type and/or n-type $Zn_3P_2$. Optionally, other kinds of semiconductor materials also may be incorporated into the composition.

The pnictide compositions used in the practice of the present invention may be amorphous and/or crystalline. Crystalline embodiments, particularly single crystal embodiments, are preferred. Exemplary crystalline phases may be tetragonal, cubic, monoclinic, and the like. Tetragonal crystalline phases are more preferred, particularly for zinc phosphide.

Pnictide compositions having photovoltaic and/or semiconducting characteristics may be of n-type or p-type. Such materials may be intrinsically and/or extrinsically doped. In many embodiments, extrinsic dopants may be used in a manner effective to help establish a desired carrier density, such as a carrier density in the range from about $10^{13}$ cm$^{-3}$ to about $10^{20}$ cm$^{-3}$. A wide range of extrinsic dopants may be used. Examples of extrinsic dopants include Al, Ag, B, Mg, Cu, Au, Si, Sn, Ge, Cl, Br, S, Se, Te, N, I, combinations of these and the like.

Pnictide films in the practice of the present invention may have a wide range of thicknesses. Suitable thicknesses may depend on factors including the purpose of the film, the composition of the film, the methodology used to form the film, the crystallinity and morphology of the film, and/or the like. For photovoltaic applications, a film desirably has a thickness effective to capture incident light for photovoltaic performance. If the film were to be too thin, too much light may pass through the film without being absorbed. Layers that are too thick will provide photovoltaic functionality, but are wasteful in the sense of using more material than is needed for effective light capture and reduced fill factors due to increased series resistance. In many embodiments, pnictide films have a thickness in the range from about 10 nm to about 4 microns, or even from about 50 nm to about 1.5 microns. By way of example, a thin film having p-type characteristics that is used to form at least part of a p-n, p-i-n, Schottky junction, or the like, may have a thickness in the range from about 1 to about 5 µm, preferably about 2 to about 3 µm. A thin film having n-type characteristics that is used to form at least part of a p-n, p-i-n, or the like, may have a thickness in the range from about 0.02 to about 2 µm, preferably about 0.05 to about 0.2 µm.

Pnictide films may be formed from a single layer or multiple layers. Single layers may have a generally uniform composition throughout or may have a composition that shifts throughout the film. A layer in a multilayer stack typically has a different composition than adjacent layer(s), although the composition of nonadjacent layers may be the similar or different in such embodiments.

Pnictide films desirably are supported upon a suitable substrate. Exemplary substrates may be rigid or flexible, but desirably are flexible in those embodiments in which the resultant microelectronic device may be used in combination with non-flat surfaces. A substrate may have a single or multilayer construction wherein at least one electrically conductive layer is in ohmic contact with the pnictide film for photovoltaic devices.

For example, one embodiment of a substrate suitable for use in photovoltaic devices includes a support and a backside electrical contact region. The support component of the substrate may be formed from a wide range of materials. These include glass, quartz, other ceramic materials, polymers, metals, metal alloys, intermetallic compositions, woven or nonwoven fabrics, natural or synthetic cellulosic materials, combinations of these, and the like. For many applications involving thin film photovoltaic devices, a conductive support such as stainless steel is preferred to enable facile contact to the back of the device. For monolithically integrated photovoltaic devices a non-conductive substrate such as glass or polyimide is preferred. The support desirably is cleaned prior to use to remove contaminants, such as organic contaminants. A wide variety of cleaning techniques may be used. As one example, plasma cleaning, such as by using RF plasma, would be suitable to remove organic contaminants from glass or metal-containing supports. Other examples of useful cleaning techniques include ion etching, wet chemical bathing, and the like.

The backside electrical contact region provides a convenient way to electrically couple the resultant device to external circuitry (not shown). The backside electrical contact region also helps to isolate the semiconductor region from the support to minimize cross-contamination. The backside contact may be formed from a single layer or multiple layer using a wide range of electrically conductive materials, including one or more of Cu, Mo, Ag, Au, Al, Cr, Ni, Ti, Ta, Nb, W combinations of these, and the like. Conductive compositions incorporating Ag may be used in an illustrative embodiment.

Generally, the backside electrical contact region has a thickness effective to provide good quality ohmic contact with the semiconductor region within the desired operating parameters (e.g., voltage and current specifications) of the resultant device. An illustrative thickness of backside electrical contact region is in the range from about 0.01 to about 1 μm, preferably 0.05 to about 0.2 μm.

Semiconductor surfaces such as Si, Ge, GaAs, ZnSe, InP, $Zn_3P_2$, and the like provide excellent surfaces on which to grow pnictide films. Therefore, in some embodiments, one or more of these materials form the surface on which the pnictide film is to be grown. GaAs, ZnSe, and Ge surfaces in particular are preferred as substrates for zinc phosphide film growth since these materials have a nearly ideal lattice match to the tetragonal zinc phosphide crystal structure. Zinc phosphide films grown on GaAs(001) and ZnSe(001) single crystal substrates have been shown to grow highly crystalline with a preferred (001) epitaxial relationship. T. Suda and K. Kakishita, Epitaxial Growth of Zinc Phosphide, J. Appl. Phys. 71(6), 15 Mar. 1992. This orientation is believed to provide an epitaxial, abrupt interface with the substrate and adjacent layers.

According to an illustrative methodology of practicing the present invention, at least one pnictide source compound is provided that serves as source of some or all of constituents to be incorporated into the thin film(s) to be grown. Using a pnictide compound as a source provides many advantages. Deriving pnictogen content from a pnictide compound significantly enhances safety in that the handling issues and safety concerns associated with pnictogen by-products are avoided. For instance, in the case of phosphorus, deriving the phosphorus from a metal pnictide compound tends to provide a vapor flux of phosphorus in the form of molecular $P_4$ as well as a vapor flux of the metal in the metal pnictide. The resultant vapor flux exiting the second heating zone can readily deposit as metal pnictide.

As another advantage, using a pnictide compound as a source provides more efficient material usage as compared to elemental sources. In particular, the vapor flux generated from a pnictide source compound such as $Zn_3P_2$ tends to include molecular $P_4$ and $P_2$ as the predominant pinctogen-containing species in the vapor flux. Between these two phosphorus species, $P_2$ has a higher sticking coefficient than $P_4$ for film growth. The terminology sticking coefficient generally refers to the ratio of atoms or molecules that adsorb to a surface relative to the total number of atoms or molecules that impinge upon a surface during a period of time. Advantageously, decomposing at least a portion of the $P_4$ after vapor flux generation increases the mole fraction of $P_2$ in the vapor flux, thereby increasing the sticking coefficient and efficiency by which phosphorous is incorporated into the growing film.

As another advantage, film composition can be adjusted and altered easily and controllably without having to switch source compounds. That is, the same source compound can be used to grow films with a range of desired compositions on demand. Furthermore, the film composition can be adjusted during growth by in situ monitoring the $P_4/P_2$ ratio and/or the film composition. Consequently, the same source compound can be used to fabricate an entire microelectronic junction, and even additional supporting layers within a device (i.e. pnictogen containing window layers) optionally in combination with other sources if desired, in the same chamber. This helps to provide high quality interfaces between the layers of the junction.

As another advantage, using pnictide compounds as sources for pnictogen(s) and the other constituent(s) of the compound allows higher processing temperatures to be used while still being able to control film growth rate. Generally, higher temperatures facilitate the growth of denser films with fewer defects. Additionally, temperature fluctuations represent a smaller fraction of the overall temperature when the temperature is higher, minimizing the impact of temperature fluctuations. Higher temperatures are available because compounds tend to vaporize at lower rates than the individual elements that make up the compound. Thus, the compounds tend to volatize more controllably at higher temperatures. In contrast, elemental sources might volatilize too fast at higher temperatures to allow adequate control over film growth.

Using pnictide source compounds also allows better control over the composition of the growing film than if one were to use only elemental sources. Without wishing to be bound by theory, it is believed that increased composition control results at least in part due the fact that source compounds such as zinc phosphide evaporate congruently. That is, the stoichiometry of the source compound is maintained during the course of evaporation in a manner analogous to azeotrope evaporation. This means that the vapor generation is consistent and uniform over time, enhancing uniform film growth and stability of growth rates over time. This kind of uniformity would be much more difficult to achieve if the composition of the source compound dynamically changed during the course of evaporation.

Pnictide source compounds can be used in combination with one or more other pnictide compounds. Pnictide source compounds can also be used in combination with other kinds of sources. Dopant sources can be used to co-supply dopants on demand during all or selected portion(s) of film growth. For example, a film can be grown with one or more dopants up to a desired film thickness. Then, additional film material can be grown with lesser amount(s) of the dopant(s), other dopants, and/or no dopant. An extrinsically doped n-type or p-type $Zn_3P_2$ film can be produced using an additional source for the dopant element or by adding the extrinsic dopant element(s) directly to the $Zn_3P_2$ source material. Using a separate source for the extrinsic dopant element allows for greater control of dopant concentration whereas combining the extrinsic dopant and $Zn_3P_2$ source material will likely fix the dopant concentration but greatly simplifies the growth process. For example, p-type doping of $Zn_3P_2$ is produced from a separate Knudsen effusion cell loaded with elemental Ag metal. The relative ratio of beam equivalent pressures of $Zn_3P_2$ and Ag, in addition to the growth temperature and growth rate will determine the concentration of Ag impurities incorporated into the $Zn_3P_2$ film. For instance, increasing the beam equivalent pressure of Ag-metal with respect to that of $Zn_3P_2$ increases the relative flux of Ag atoms to Zn, $P_2$, and $P_4$ atoms and molecules impinging on the substrate surface, therefore increasing the total Ag dopant concentration. Other possible sources for both n- and p-type dopants in $Zn_3P_2$ could include but are not limited to standard effusion cells, electron-beam evaporators, and RF-atomic gas sources.

Additional elemental sources also could be used. For example, in the case of zinc phosphide, elemental zinc can be co-introduced to increase film growth rate. Additional metals or non-metals such as Cd, Mg, Al, In, Ge, Sn, B, S, Se, and/or Te may also be introduced from a supplemental source during film growth in larger quantities in order to fowl alloyed $M_xA_y$-$Pn_z$ materials. Elemental pnictogen could also be co-introduced, but this might unduly increase the need for safety precautions.

In the practice of the present invention, the pnictide source compound is treated in a first processing zone under conditions effective to create a vapor flux and in a second processing zone under conditions effective to decompose at least one portion of the vapor flux. The vapor flux that is derived at least in part from the source compound(s) and optionally one or more other sources may be generated or decomposed in a variety of ways. For example, the source compound may be exposed to RF energy, ion bombardment, vacuum, heating, laser ablation, combinations of these, and the like to generate a vapor flux derived at least in part from the source compound.

Figure 2:
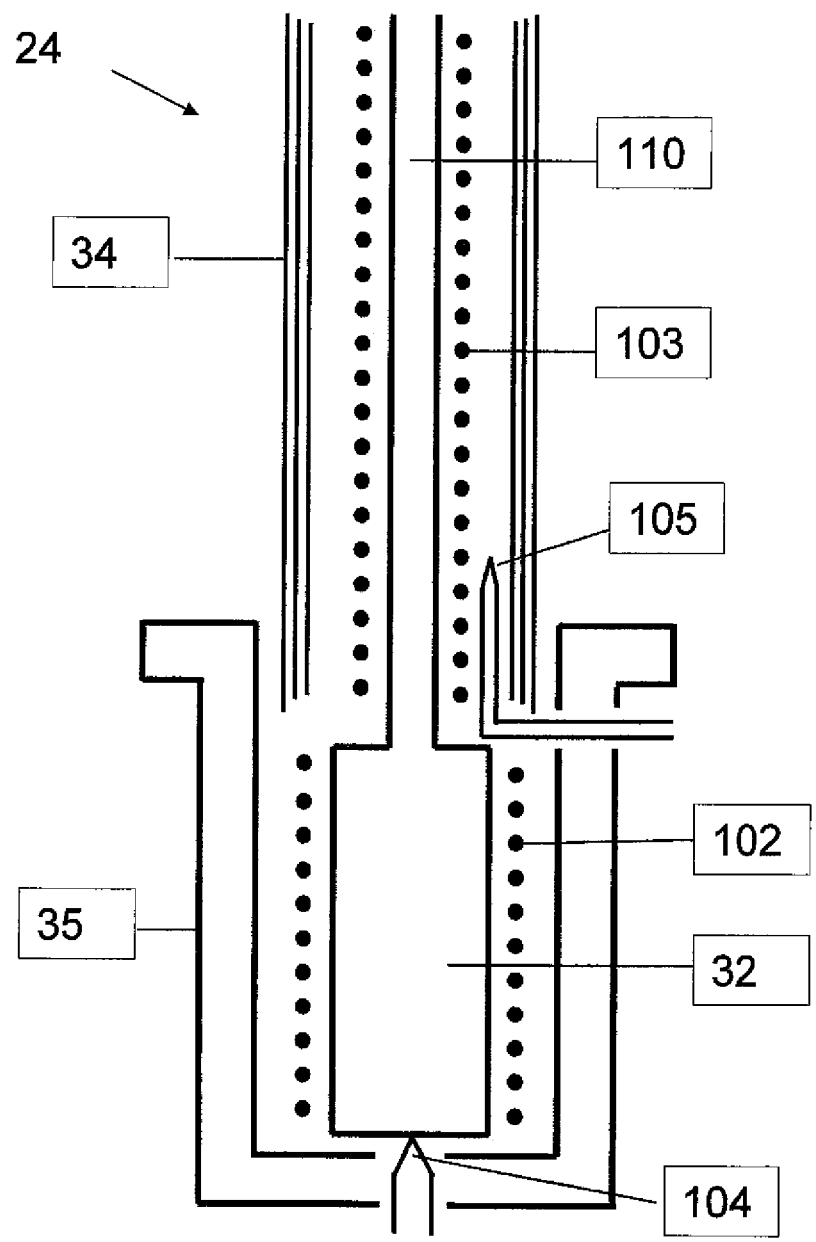
FIG. 2 is a more detailed, schematic illustration of a source assembly used in the apparatus of FIG. 1, wherein the source assembly has two independent heating zones for implementing techniques of the present invention.

A thermal treatment under vacuum in a protected atmosphere is preferred for generating the vapor flux. A wide range of temperatures may be used to generate a vapor flux from a pnictide source compound. However, if the temperature is too low, film growth may occur too slowly to meet desired throughput objectives. On the other hand, if the temperature is too high, the film growth rate may be so fast that it is more difficult to control growth and film quality. For instance, if the temperature is too high, it may be more difficult to grow dense films with low defects. Balancing such concerns, exemplary temperatures for generating a vapor flux are in the range from about 150° C. to about 450° C., preferably about 200° C. to about 450° C., more preferably, about 300° C. to about 400° C. This temperature may be measured by a suitable temperature sensing device, e.g., a thermocouple that senses bulk temperature of the source compound. For example, in one mode of practice, the source compound (e.g., $Zn_3P_2$) is heated in a tantalum crucible that has a cylindrical bottom half. A thermocouple makes contact to the outside of the crucible on the center of the bottom flat. This thermocouple placement is shown in FIG. 2, described further below. Preferably, the temperature of the first heating zone is measured at the base of the first heating zone in direct thermal contact with the pnictide source compound.

In many typical embodiments, it is desirable to select a temperature to generate the vapor flux that facilitates film growth at a desired rate. More desired growth rates provide an excellent balance between throughput and control. Exemplary growth rates can range from about 0.1 nm per second to about 200 nm/s in many embodiments. In one exemplary embodiment in which a zinc phosphide source compound is used, a temperature of 350° C. would generate a suitable vapor flux.

The constituents of a generated vapor flux will depend upon a variety of factors such as the composition of the source(s) used to generate the flux, the conditions used to generate the flux, and the like. It has been observed that that metals such as zinc sublime atomically from pnictide compound sources rather than as clusters or as compounds. Pnictogen content tends to sublime from pnictide compounds predominantly in the form of $P^N_4$ and $P^N_2$ species. For example, thermally treated zinc phosphide tends to form vapor species including atomic zinc on the one hand and molecular phosphorous species such as $P_4$ and $P_2$ on the other hand. $P_4$ tends to be more thermodynamically favored than $P_2$ at temperatures below about 400° C., particularly below about 300° C. Molecular phosphorus species having longer chains as well as $P_3$ species also may exist, but in smaller quantities than the $P_4$ and $P_2$ species.

Whereas the vapor flux is generated under appropriate conditions in a corresponding processing zone, the vapor flux next is treated in a separate, second processing zone under suitable conditions effective to decompose at least a portion of at least one species of the vapor flux. Thus, in the practice of the present invention, vapor flux generation and vapor flux decomposition occur in two separate treatments in different processing zones. This recognizes that some degree of decomposition may occur concurrently in the first processing zone in which the vapor is generated. However, even if some initial decomposition were to occur in the first processing zone concurrently with vapor generation, the present invention contemplates that at least some degree of additional decomposition occurs in a second processing zone so that vapor generation and at least a portion of the decomposition functions occur independently.

Preferably, the decomposition conditions are effective to decompose at least a portion of the molecular pnictogen content of the vapor flux. "Decompose" means that a species is converted to one or more species of lower average molecular weight than that of the starting species. In the practice of the invention, decomposition encompasses bond breaking, forming new bonds, reactions between two or more species, intraspecies reactions, combinations of these, and the like.

Exemplary decomposition conditions involve thermally treating the vapor flux in the second processing zone. A wide range of temperatures in the second processing zone may be used to accomplish the desired decomposition. Exemplary temperatures are in the range from about 300° C. to about 1200° C., preferably about 350° C. to about 1000° C., more preferably about 500° C. to about 1000° C. Preferably, the decomposition temperature is desirably greater than the temperature used to generate the vapor flux, and preferably is at least about 50° C., more preferably at least about 75° C., and more preferably at least about 100° C. greater than the temperature used to generate the vapor flux. To measure this temperature, a suitable temperature sensing device is located in a suitable position in the second processing zone effective to measure the bulk temperature of the vapor flux moving through the zone. Preferably, temperature is measured in substantial direct contact with the heating element(s) used to attain decomposition temperature. When more than one element is used, an average temperature may be used. For example, in one embodiment the second processing zone is housed within an upper portion of a tantalum crucible whose lower portion holds the source compound. Resistive elements surround the upper portion of the crucible to provide heat for the second processing zone. The filaments in turn are surrounded by a heat shield. Such a configuration is shown in FIG. 2, described further below. A thermocouple can be positioned along the center of the length of the second processing zone between the resistive elements and the heat shield.

The thermal treatment of molecular phosphorous illustrates how decomposition may be practiced in exemplary embodiments. When sufficiently heated, molecular $P_4$ generally decomposes to form molecular $P_2$. This decomposition is an equilibrium reaction in which the degree of decomposition is a function of the decomposition temperature. Generally, the formation of $P_2$ becomes more favored with increasing temperature. Thus, the mole fraction of $P_2$ in the vapor flux relative to $P_4$ tends to increase with increasing temperature, while the mole fraction of $P_4$ in the vapor flux relative to $P_2$ tends to increase with lower temperature.

A similar effect would be observed upon thermal treatment of other molecular pnictogen species. Thus, $Sb_4$ tends to decompose to $Sb_2$ upon thermal treatment, wherein the amount of $Sb_2$ formed and the amount of $Sb_4$ that decomposes generally tend to increase with increasing temperature. Similarly, $As_4$ tends to decompose to $As_2$ upon thermal treatment, wherein the amount of $As_2$ formed and the amount of $As_4$ that decomposes generally tend to increase with increasing temperature.

The present invention appreciates that the decomposition of molecular pnictogens, such as $P_4$ to $P_2$, is an equilibrium reaction whose equilibrium constant is a strong function of temperature. With respect to molecular phosphorus, FIG. 7b is a graph that schematically shows this strong temperature dependence. There, the mole fraction of $P_4$ relative to total moles of $P_4$ and $P_2$ is shown as a function of temperature over a temperature range from 350° C. to 1000° C. The graph shows both theoretical data as well as experimental data. Note how the experimental data reasonably closely matches the theoretical data. The data show that $P_4$ predominates at 350° C., but that the amount of $P_2$ steadily increases with increasing temperature. At about 800° C., most of the molecular phosphorus is in the form of molecular $P_2$, and very little, if any, $P_4$ is present.

The data shown in FIG. 7b show how a decomposition temperature in the second processing zone can be selected to achieve a desired mole fraction between $P_2$ and $P_4$ species. Similar selections of decomposition temperature would be used to achieve desired compositions of molecular antimony and arsenic species from corresponding information showing composition data as a function of temperature.

Hence, the decomposition temperature in the second processing zone can be used to accurately control the molecular pnictogen content in a thermally treated vapor. If more $P^N_2$ is desired relative to $P^N_4$ (where $P^N_2$ generally denotes molecular pnictogen composed of two pnictogen atoms and $P^N_4$ denotes molecular pnictogen composed of four pnictogen atoms), a higher decomposition temperature can be used. If more $P^N_4$ is desired relative to $P^N_2$, then a lower decomposition temperature can be used.

Significantly, not only is the mole fraction of molecular pnictogens in a vapor a strong function of temperature in the second processing zone, the composition of the film being grown, in turn, is a strong function of the molecular pnictogen content of the vapor. Specifically, the amount of pnictogen incorporated into the growing film tends to increase with greater $P^N_2$ content in the vapor flux. Conversely, the amount of pnictogen incorporated into the growing film tends to be lower with lesser amounts of $P^N_2$ content in the vapor flux.

Because decomposition temperature in the second processing zone can be used to control the mole fraction of molecular pnictogens in a vapor flux, it follows from this discussion that the decomposition temperature offers an excellent vehicle for controlling the film composition of the growing film. If it is desired to incorporate relatively greater amounts of pnictogen into the film, higher decomposition temperature(s) can be used to provide a treated vapor flux that has relatively more $P^N_2$ species than a vapor flux treated at lower temperatures. If it is desired to incorporate relatively lesser amounts of pnictogen into the film, then lower decomposition temperature(s) can be used to provide a treated vapor flux that has relatively lesser amounts of $O_2$ species.

Thus, appropriate selection of the decomposition temperature in the second processing zone can be used to control whether metal pnictide films grown in the practice of the present invention are formed with stoichiometric amounts of metal(s) and pnictogen(s) in the film, or else whether the metals on the one hand or the pnictogens on the other hand are deposited in stoichiometric excess relative to the other.

The principles of the present invention may be practiced to provide metal pnictide films having a wide range of compositions. For example, exemplary metal pnictide films grown using principles of the present invention may have a $M_x:P^N_y$ molar ratio in the range of about 0.2 to about 2, preferably about 0.8 to about 1.4, wherein M represents one or more metals, $P^N$ represents one or more pnictogens, x represents the stoichiometric amount of metal (e.g., for stoichiometric $Zn_3P_2$, x would be 3; for stoichiometric $ZnP_2$, x would be 1), y is the stoichiometric amount of pnictogen (e.g., for stoichiometric $Zn_3P_2$, y would be 2; for stoichiometric $ZnP_2$, y would be 2). This ratio is 1.0 when the metal(s) and pnictogen(s) are present in their stoichiometric amounts. Stoichiometric metal pnictide compositions tend to have intrinsic p-type characteristics in the instance of $Zn_xP_y$ with a molar ratio of 1.5, or x=3 and y=2. The molar ratio is less than 1 when the pnictogen(s) are present in stoichiometric excess relative to metal(s). Such compositions also tend to have intrinsic p-type characteristics. The ratio is greater than 1 when the metal(s) are present in stoichiometric excess. In some embodiments, such compositions would be believed to have intrinsic n-type characteristics. T. Suda and K. Sasaki, N-Type Zinc Phosphide Grown by Molecular Beam Epitaxy, Appl. Phys. Lett. 69 (16) October 1996. In these illustrative embodiments, the intrinsic p- or n-type characteristics may be enhanced via the use of extrinsic dopants in accordance with conventional practices now or hereafter known.

The relationship between film composition and decomposition temperature in the second processing zone may be exploited in the practice of the present invention for enhanced stoichiometric control over the composition of the growing film. According to an illustrative methodology, information is provided that correlates decomposition temperature to film composition. Preferably, the information is indicative of how the relative amount of metal and/or the pnictogen content in the film is a function of at least a temperature characteristic associated with the decomposition conditions. The information is then used to select a decomposition temperature suitable for growing film material with the desired composition characteristics. The information can be used directly to select process conditions used to form all or a portion of a film. The information can also be used in process control strategies to help achieve and maintain desired film characteristics during growth. According to process control concepts, the growing film can be monitored to assess whether desired composition objectives are being met or whether process control actions are desired. For instance, if monitoring shows that the growing film needs more pnictogen content, the decomposition temperature in the second processing zone can be increased to accomplish this. If monitoring shows that the growing film needs more metal content, the decomposition temperature can be reduced to accomplish this.

Such information also can be used to grow films made from multiple layers for which the compositions differ between adjacent layers. The growth conditions may be controlled appropriately such that distinct individual layers are formed. Alternatively, the growth conditions may be adjusted in a continuous fashion during growth to achieve a composition gradient. Thus, the information can be used to select decomposition conditions in the second processing zone effective to grow a film layer having a certain target composition. The decomposition conditions can then be adjusted using the information as a guide in order to grow an additional layer having another target composition. Further adjustment of the decomposition conditions can be used to deposit additional layers to complete the film, if desired. Film compositions of the various layers can also be controlled by choosing different source(s) to generate various vapor flux compositions suitable for the different stages of deposition. For instance, a film initially can be grown using a zinc phoshide composition source. After growing a suitable film thickness, additional sources may be used to incorporate additional ingredients into the vapor flux, e.g., Sb, Ag, Al, Ga, Ti, Ta, Si, B, Sn, Ge, S, Se, Te, combinations of these, and the like, to grow additional film material incorporating such additional ingredients.

In preferred modes of practice, selecting and/or adjusting the decomposition temperature allows tuning the composition of the growing film so that p-type or n-type material can be grown on demand during the course of generally the same deposition in the same process chamber. The transition from depositing p-type to n-type (or vice versa) can be accomplished as simply as by changing the decomposition temperature to favor depositing a pnictogen rich film (p-type) or a metal-rich film (n-type). Significantly, n-type and p-type materials can be grown from one or more common source compounds, although additional source(s) of ingredients also may be used in each case to grow the n-type or p-type material, respectively.

These strategies can be used to grow a p-n homojunction. For example, using zinc phosphide as an illustrative context, a vapor flux can be generated from a zinc phosphide source compound. This vapor flux then is decomposed at a temperature that favors growing a phosphorous-rich, p-type pnictide film. Optionally, additional ingredients may be supplied from the same source compound or other sources to enhance the quality of the p-type material. In an illustrative embodiment, the p-type layer would have a thickness on the order of about 2000 nm, although thicker or thinner layers could be used as well. While continuing to generate the vapor flux, the decomposition temperature can be adjusted to favor the growth of metal-rich, n-type material. In an illustrative embodiment, the n-type layer would have a thickness on the order of about 80 nm, although thicker or thinner layers could be used if desired. Optionally, additional ingredients may be supplied from the same source compound or other sources to enhance the quality of the n-type material. In this way, the p-n homojunction is formed.

A photovoltaic device incorporating this p-n junction could then be completed by deposition of an optional window/passivation layer, a transparent top contact layer, and an optional top collection structure. Optional protective layers also may be formed.

In addition to forming p-type and/or n-type films, the principles of the present invention can also be used to incorporate additional kinds of pnictide films into microelectonic devices. In one mode of practice, the strategies can be used to form a pnictide film that functions as window/passivation layer over a microelectronic junction. For example, a pnictide source compound, e.g., a zinc phosphide source, can be used to grow all or a portion of a p-n junction, which in illustrative embodiments may be a heterojunction or a homojunction. After the junction is formed, a material such as Mg from a suitable source can be co-introduced with the vapor derived from the pnictide source compound. When Mg is included in the vapor flux along with metal and pnictogen species such as zinc and phosphorous species, the film is now grown with a ternary composition of Zn, Mg, and P. This ternary composition allows the film to function as a window/passivation layer. Such layers provide many benefits, including enhancing band gap properties, preventing shunt propagation, and the like. Note that at least a portion of the ingredients used to form the window/passivation layer are sourced from the same source compound that was used to form at least a portion of the underlying p-n junction.

It can be appreciated from this discussion that the vapor flux generation and vapor flux decomposition functions are handled at least to some degree in different processing zones and therefore can be accomplished independently. Separating these functions so that these functions occur independently at least to some degree in different processing zones provides significant processing advantages. Firstly, it is generally desirable to generate a vapor flux that allows appropriate control over the growth rate in order to grow higher quality films. If the flux rate is too high, it is more difficult to control growth rate. Poor quality films tend to result when the growth rate is too high. In particular, it is much more difficult to grow dense films with low defects when the flux rate is too high. Thus, so long as throughput objectives are satisfied, lower growth rates are better for controlled growth. Because vapor flux rate generally increases with increasing temperature, generating a vapor flux at lower temperatures is more favorable for controlled film growth.

Yet, it is also desirable to generate a vapor flux whose vapor species that have a favorable sticking coefficient to promote good film growth. This objective also is temperature sensitive. At low temperatures, the pnictogen content of the source compound tends to sublime predominantly as $P^N_4$ species with lesser amounts of $P^N_2$ species. $P^N_4$ species tend to have a much lower sticking coefficient for film growth than $P^N_2$. Hence, using lower sublimation temperatures may lead to films that are too deficient in pnictogen content. At higher temperatures, the content of the $P^N_2$ is higher to provide a more favorable sticking coefficient. However, the growth rate will be more difficult to control. Hence, using higher sublimation temperatures generates more favorable vapor species but generates an unfavorable flux of those species that is too high.

Unfortunately, whereas lower temperatures are suitable for controlling growth rate, higher temperatures are more suitable to obtain pnictogen-containing species having more favorable sticking coefficients. The technical challenge, then, is how to generate both a favorable flux rate and favorable species when the conditions that favor one of these objectives disfavor the other.

The present invention provides a simple but elegant technical solution for this challenge. The present invention initially generates a suitable vapor flux from the source compound in a first processing zone, and then decomposes the vapor flux in a second zone to generate more favorable vapor species. Separating these functions into separate processing zones allows great control over the sticking coefficient without generating a vapor flux that is too high.

One can appreciate, therefore, that the temperature in the first processing zone used to generate the vapor flux is generally less than the temperature in the second processing zone used to generate more favorable vapor species via decomposition. The generation temperature is lower so that the vapor flux is not too high. The decomposition temperature in the second processing zone is higher to facilitate the desired conversion into lower molecular weight species with more favorable sticking coefficients.

Performing vapor generation and vapor decomposition functions in separate processing zones provides additional advantages. Significantly, the mole fraction of molecular pnictogen species (predominantly the relative amounts of $P^N_2$ and $P^N_4$ species) is a strong function of decomposition temperature in the second processing zone and hence can be controlled via temperature adjustment in the second processing zone. Because the film composition, in turn, is strongly dependent upon the relative amounts of $P^N_2$ and $P^N_4$ species in the vapor flux, the decomposition temperature in the second processing zone can be adjusted on demand to control the relative amount of pnictogen incorporated into growing films. Adjusting decomposition temperature in the second processing zone, therefore, allows the composition of the growing film to be tuned on demand during film growth.

The ability to tune the film composition on demand offers many advantageous strategies to fabricate films and film structures with excellent stoichiometric control. One strategy involves the in situ, selective fabrication of intrinsically doped p-n homojunctions. For example, in the case of zinc phosphide films, principles of the invention can be used to deposit phosphorous rich, p-type $Zn_3P_2$ (or $ZnP_2$). After the desired thickness of p-type film is grown, the decomposition temperature can then be adjusted so that additional growth forms zinc-rich, n-type material. The same source compound can be used to grow at least a portion of each of the p-type and re-type material. Optionally, extrinsic dopants may be introduced into the growing p-type or n-type films, as desired, to further enhance film quality.

During growth of the films on a substrate, the substrate may be chilled, at ambient temperature, or heated during film growth. Preferably, the substrate is heated. In those modes of practice in which the substrate is heated, exemplary substrate temperatures are in the range from about 40° C. to about 500° C., preferably about 75° C. to about 400° C., more preferably about 100° C. to about 400° C. In one mode of practice in which a zinc phosphide film is being grown from a zinc phosphide source compound, a substrate temperature of 200° C. would be suitable.

The substrate temperature impacts film characteristics including grain size, porosity, density, crystallinity, and the like. For example formation of crystalline material is favored by higher substrate temperatures, while amorphous material is more favored at lower substrate temperatures. Additionally, the substrate temperature also may impact film composition. Generally, lower substrate temperatures, e.g., about 300° C. or lower, preferably about 200° C. or lower, for zinc phosphide, favor the formation of materials that are relatively richer in pnictogen content. Moderate temperatures, e.g., around 300° C. for zinc phosphide, tend to favor formation of stoichiometric material. Higher temperatures, e.g., above about 375° C. for zinc phosphide, tend to favor formation of metal rich material. Thus, lower substrate temperatures may be favored when forming p type material, whereas higher substrate temperatures would be favored to form n-type materials.

Optionally, the substrate is rotated during film growth. This could help promote more uniform film growth. A wide range of rotation rates may be used. In many modes of practice, suitable rotation rates are in the range from about 0.01 to about 200 rpm, preferably about 0.1 to about 100 rpm. In one mode of practice in which a zinc phosphide film is being grown, a rotation rate of 6 rpm would be suitable.

Pnictide films grown using the practice of the present invention may be further processed as desired to enhance quality or performance. As one option, films may be annealed. In the cases where multiple layers of pnictide material are being grown to form a film stack, annealing may be practiced after all the layers are grown. Alternatively, annealing may be practiced in between the growth of individual layers. For instance, a vapor flux can be used to grow an initial film layer. The vapor flux is stopped or otherwise reduced and the film layer is annealed. Then the flux can be restored or otherwise increased to grow additional material which optionally would be annealed as well.

For some pnictides, annealing in the presence of the pnictogen species in the material can afford beneficial effects. For instance, the annealing of $Zn_3P_2$ in $P_4$ vapor at pressures of $1\times10^{-10}$ Torr and at 400° C. results in an increase in the p-type character of the material to about $5\times10^{16}$ holes*$cm^{-3}$. Furthermore, an annealing step may result in improved morphology and/or crystallinity in the semiconductor layer that renders it more suitable for the deposition of an additional layer with fewer defects such as interlayer or interfacial defects. This can be very desirable when forming a p-n junction.

A variety of other additional treatments may also be practiced on the pnictide films. For example, the films may be subjected to additional doping treatments, exposure to hydrogen, exposure to nitrogen, ammonia, phosphine, plasma treatment, ion bombardment combinations of these, and the like.

An exemplary apparatus 10 that may be used to practice principles of the present invention is schematically shown in FIGS. 1 and 2. Referring first to FIG. 1, apparatus 10 includes housing 12 defining process chamber 14. Heatable chuck 16 is supported by rotatable shaft 18. Substrate 20 is mounted on chuck 16 in any suitable fashion. In one mode of practice, copper beryllium clips are used to hold the substrate 20 on the chuck 16. Substrate manipulator 22 allows x, y, z translation of the chuck 16. One or more source assemblies 24, 25, 26, and 27 supply beams 28, 29, 30, and 31, respectively, aimed toward substrate 20. For purposes of illustration, four source assemblies are shown. In actual practice, more or less source assemblies may be used depending upon film growth objectives.

As illustrated, source assembly 24 includes tantalum crucible 32 holding a pnictide source compound. Heat shield 34 defines a pathway aimed at substrate 20. Heat shield 34 may be formed from tantalum in some embodiments. The other assemblies are fitted with similar heat shields 35. A heating element 36 allows the heat shield 34 and its contents to be heated independently of cell 32. In this particular embodiment, heated cell 32 provides a first processing zone in which a vapor flux derived from the pnictide source compound can be generated and then transported to substrate 20 as beam 28. The heat shield 34 provides a second processing zone in which the vapor flux can be heated independently at a suitable decomposition temperature to achieve desired film composition goals.

The other source assemblies 25, 26, and 27 may store supplies of other ingredients that may be used to grow films. By way of example, source assembly 25 may include one or more materials such as Zn, ZnSb, ZnSe, ZnTe, or the like. Source assembly 26 may include a dopant such as Ag or Al. Source assembly 27 might include another metal or dopant such as Mg.

Each source assembly 24, 25, 26, and 27 may be associated with its own growth shutter 40 in order to respectively block beams 28, 29, 30, and/or 31 on demand as desired. For purposes of illustration, only a single shutter 40 is shown for clarity.

RHEED gun 42 and corresponding phosphor screen 44 allow in situ analysis of the growing film. The phosphor screen 44 is responsive to the electron beam 46 emitted by the RHEED gun 42 and reflected by the growing film on the substrate 20. The diffraction peaks detected by the screen 44 can be used for evaluation of the film.

A quadrapole mass spectrometer 48 allows in situ analysis to monitor the chamber environment. The spectrometer 48 can be used to detect whether undesirable oxygen and/or carbon might be present, for instance.

FIG. 2 shows the source assembly 24 in more detail. Assembly 24 includes a removable tantalum crucible 32 that holds a supply (not shown) of a pnictide source compound. Crucible 32 is housed in water-cooled, stainless steel base 35. Resistive tungsten heating coil 102 is used to heat crucible 32 and its contents. The heated crucible 32 provides a first processing zone in which to generate a vapor flux from the pnictide source compound. C-type thermocouple 104 is used to monitor the temperature of crucible 32.

Conduit 110 extends from crucible 32 and is aimed toward the substrate 20 (FIG. 1). Resistive tungsten heating coil 103 is used to heat the vapor flux generated from the source compound. Heating coil 103 operates independently of coil 102. The heated conduit 110 provides a second processing zone in which the vapor flux is subjected to a decomposition treatment. C-Type thermocouple 105 is used to monitor the temperature of the conduit 110. Heat shield 34 helps to prevent loss of heat energy from the assembly 24.

Figure 3:
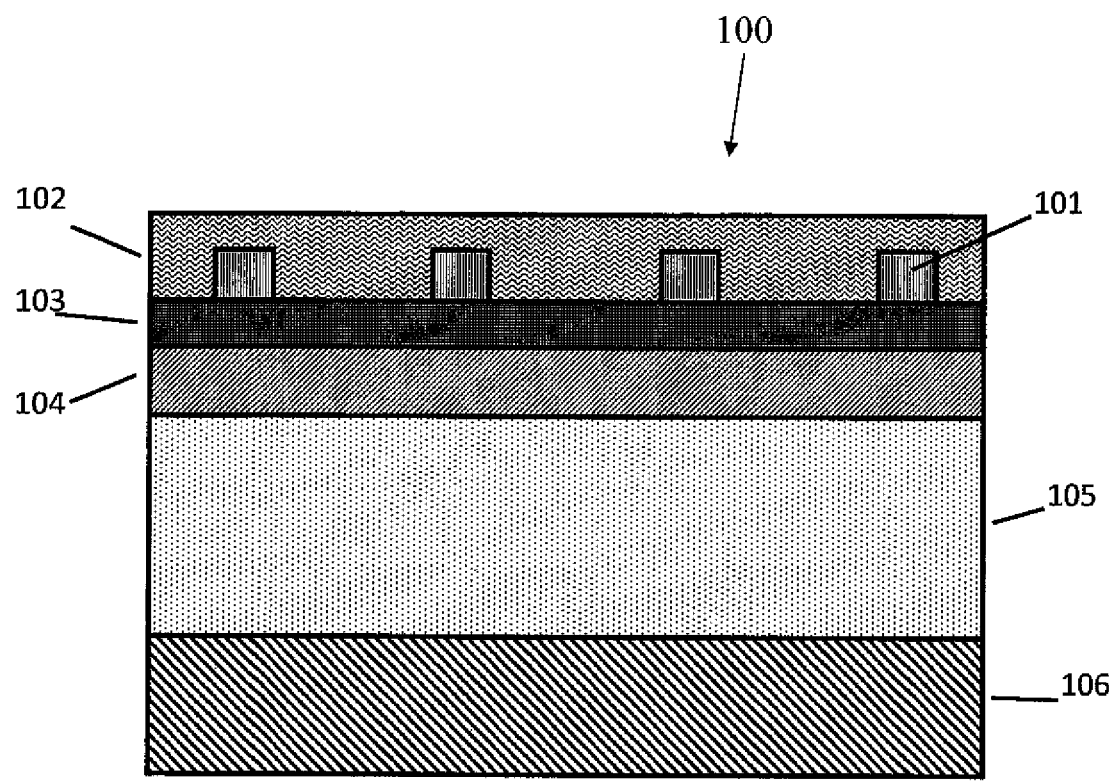
FIG. 3 is a schematic diagram showing a substrate p-n junction solar cell 100 of the present invention.

FIG. 3 shows an exemplary photovoltaic device of the present invention in the form of substrate p-n junction solar cell 100. The cell 100 includes front metal contact 101, antireflection coating 102, transparent conductive oxide later (AZO, ITO, etc.) 103, N-type semiconductor layer (either n-type $Zn_3P_2$ or n-type heterojunction partner, e.g., ZnS, ZnSe, ZnO, etc.) 104, p-type $Zn_3P_2$ semiconductor layer 105, and growth substrate (GaAs, ZnSe, Ge, Stainless steel, Mo, Al, etc.) 106.

Figure 4:
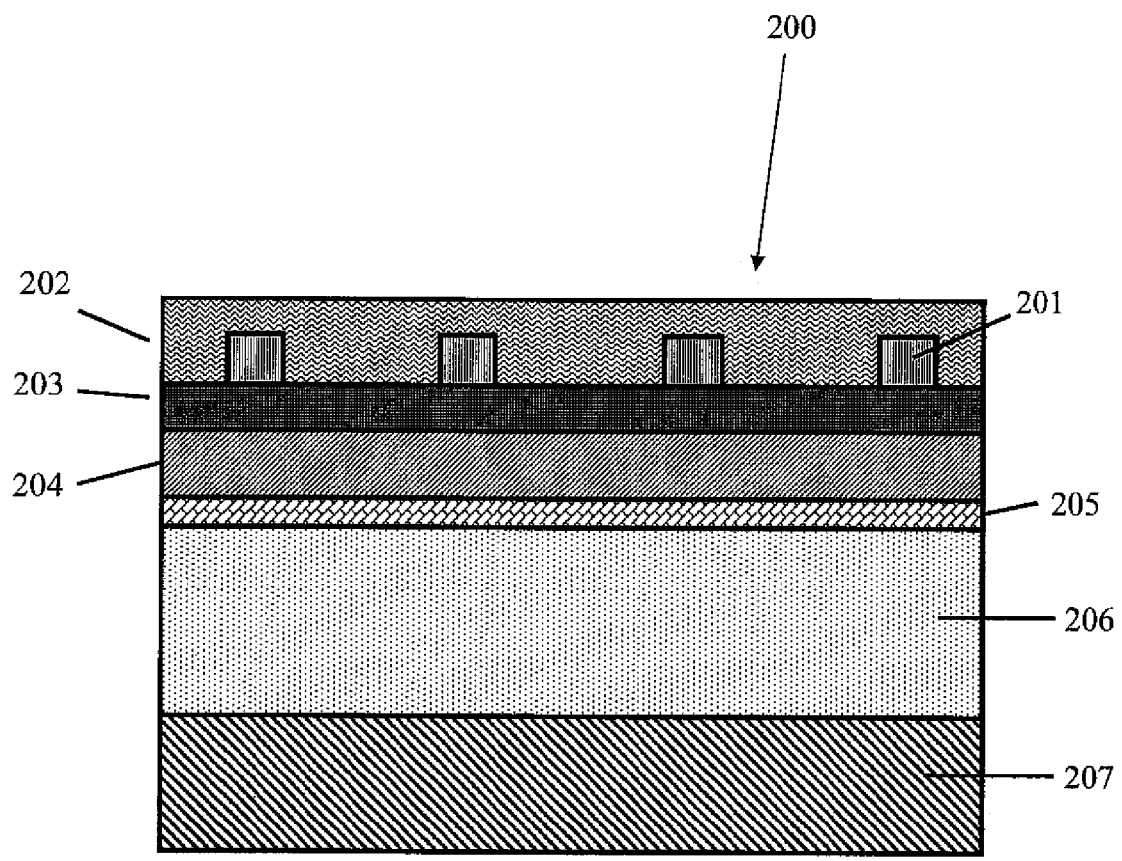
FIG. 4 is a schematic diagram showing a substrate p-i-n junction solar cell 200 of the present invention.

FIG. 4 shows another exemplary photovoltaic device of the present invention in the form of substrate p-i-n junction solar cell 200. Cell 200 includes front metal contact 201, antireflection coating 202, transparent conductive oxide later (AZO, ITO, etc.) 203, n-type semiconductor layer (either n-typed $Zn_3P_2$ or n-type heterojunction partner, i.e. ZnS, ZnSe, ZnO, etc.) 204, intrinsic semiconductor layer 205, p-type $Zn_3P_2$ semiconductor layer 206, and growth substrate (GaAs, ZnSe, Ge, Stainless steel, Molybdenum) 207.

Figure 5:
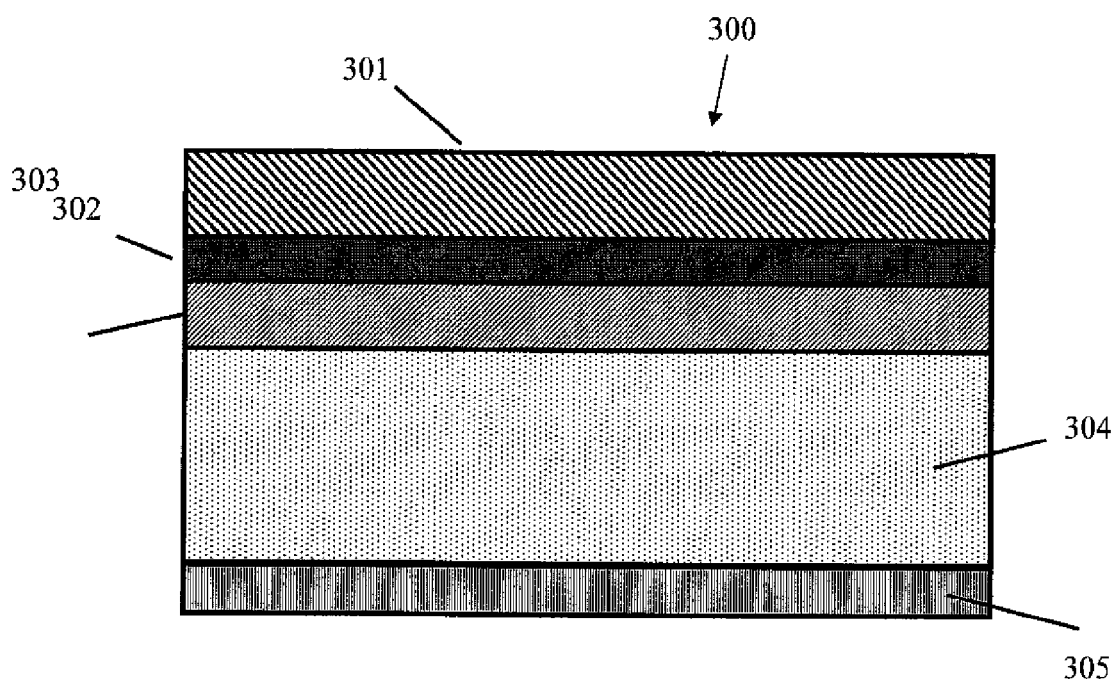
FIG. 5 is a schematic diagram showing a superstrate p-n junction solar cell 300 of the present invention.

FIG. 5 shows another exemplary photovoltaic device of the present invention in the form of superstrate p-n junction solar cell 300. Cell 300 includes transparent glass or polymer substrate 301 which is optionally flexible, transparent conductive oxide later (AZO, ITO, etc.) 302, n-type semiconductor layer (either n-typed $Zn_3P_2$ or n-type heterojunction partner, i.e. ZnS, ZnSe, ZnO, etc.) 303, p-type $Zn_3P_2$ semiconductor layer 305, and reflective & conductive back contact (Ag, Al, etc.).

The present invention will now be further described with reference to the following illustrative examples.

EXAMPLE 1

Growth of $Zn_3P_2$ Thin Films from a $Zn_3P_2$ Compound Source and Supplemental Zn Source An undoped GaAs(001) growth substrate was first etched in $H_2SO_4$:$H_2O_2$:$H_2O$ (4:1:100 vol) for two minutes followed by an HCl:$H_2O$ (1:3) etch for an additional two minutes, then rinsed in DI water for 20 to 30 seconds and nitrogen blow-dried. The substrate was attached to a molybdenum sample holder using copper-beryllium clips. A small area of lithographic mask was applied to the surface of the wafer which could later be removed by acetone after growth for determining film thickness. The substrate holder was then immediately placed under vacuum.

Within a molecular beam epitaxial growth chamber, the sample was first annealed at 300° C. for 30 minutes to 1 hour to outgas any water or carbon contaminents followed by a higher temperature anneal at 450° C. which facilitated reconstruction of the GaAs surface. The substrate was allowed to cool to 200° C., during which time both the $Zn_3P_2$ compound source and zinc metal effusion cell were heated at rates of 12° C. per minute to 350° C. and 330° C. respectively. The $Zn_3P_2$ thermal decomposition region was heated to 1000° C. Substrate and source temperatures were controlled using PID control strategies with temperature deviations limited to +/−0.1° C. The $Zn_3P_2$ thermal decomposition region was controlled manually. Once the substrate temperature stablized at 200° C., growth was initiated by opening source and substrate shutters. During growth the sample was rotated in plane at approximately 0.1 rotations per second (RPS). The chamber background pressure during growth was less than $5 \times 10^{-8}$ Torr. After 60 minutes of growth, all shutters were closed and both substrate and source temperatures were decreased to room temperature. Film composition was determined to be $Zn_3P_2$ using Energy Dispersive X-ray spectroscopy (EDS).

EXAMPLE 2

Figure 6A:
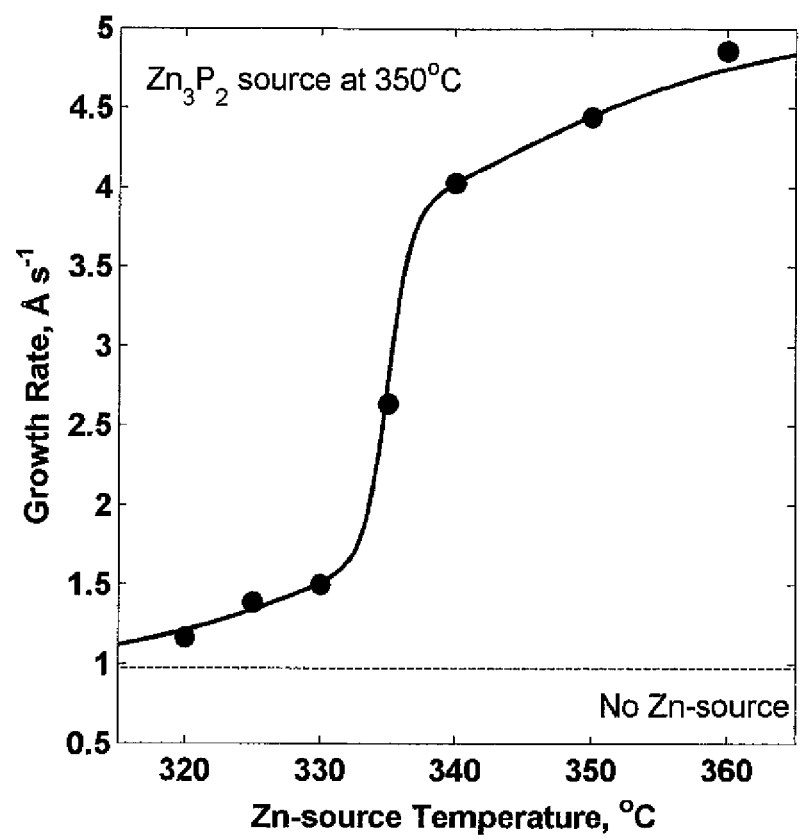
FIG. 6a shows the influence of additional zinc source flux on growth rate of zinc phosphide thin films.
Figure 6B:
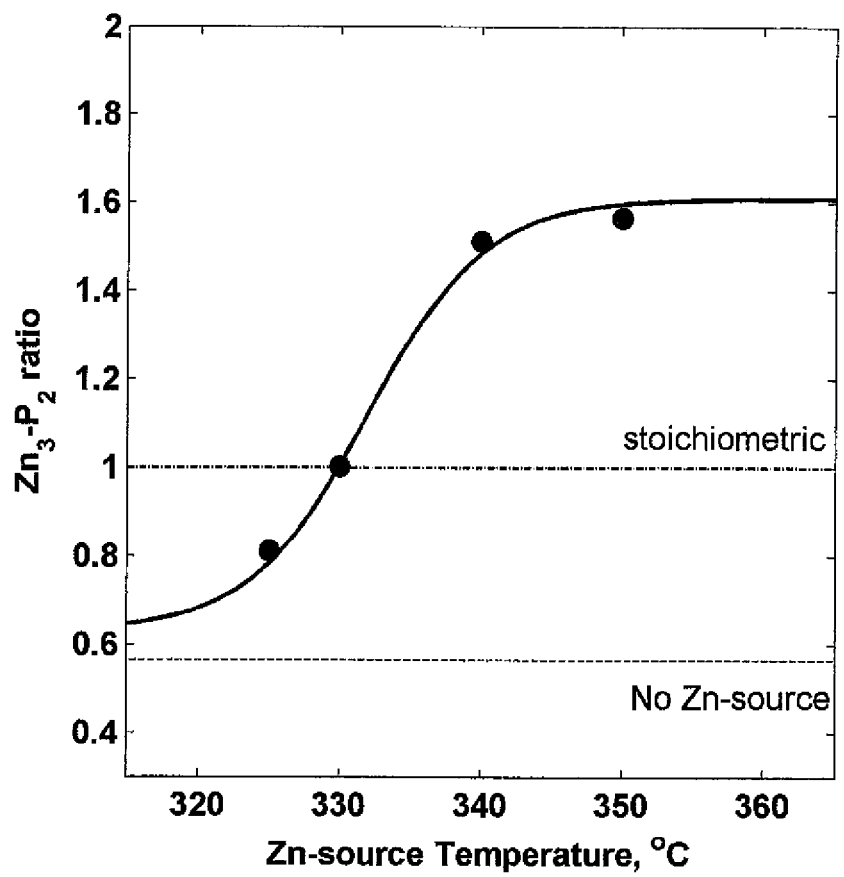
FIG. 6b shows the influence of additional zinc metal flux on the stoichiometry of grown films.

Growth of $Zn_xP_y$ Thin Films from a $Zn_3P_2$ Compound Source and Supplemental Zn Source Several experiments were conducted in the exact same manner as outlined in Example 1 except that the temperature of the zinc metal effusion cell was set to 320° C., 325° C., 330° C., 335° C., 340° C., 350° C., and 360° C., respectively. Data is shown in FIGS. 6A and 6B. FIG. 6a shows the influence of additional zinc source flux on growth rate of zinc phosphide thin films. A clear increase in growth rate was observed as the temperature of the zinc source was increased past 330° C. Films grown with the zinc source below 330° C. were found to be amorphous in nature. Crystalline $Zn_3P_2$ films were obtained for zinc source temperatures at or greater than 300° C. Film thicknesses were measured by profilometry. FIG. 6b shows the influence of additional zinc metal flux on the stoichiometry of grown films. Films grown without the additional zinc source were found to be phosphorus rich. A perfect $Zn_3P_2$ stoichiometry was obtained for a zinc source temperature of 330° C. Above this temperature, the resulting $Zn_3P_2$ film contained zinc metal impurities. Film composition was determined using Energy Dispersive X-ray spectroscopy (EDS). As shown in these figures, growth rate and Zn mole fraction of the thin film both increased with increasing zinc metal effusion cell temperature. Film composition was determined using Energy Dispersive X-ray spectroscopy (EDS).

EXAMPLE 3

Control of $P_4/P_2$ Ratio in the Flux Via Temperature Control in the Thermal Cracking Zone Using a $Zn_3P_2$ Compound Source In a molecular beam epitaxial chamber, the source temperature for sublimation of $Zn_3P_2$ was heated at a rate of 12° C. per minute to 350° C. and held at that temperature. The cracker temperature in the decomposition zone was adjusted between 400° C. and 1000° C. and the partial pressures of tetramer and dimer species were determined in situ using a quadrapole mass-spectrometer located within the effusion cell beam path. Data is shown in FIGS. 7a and 7b.

Figure 7A:
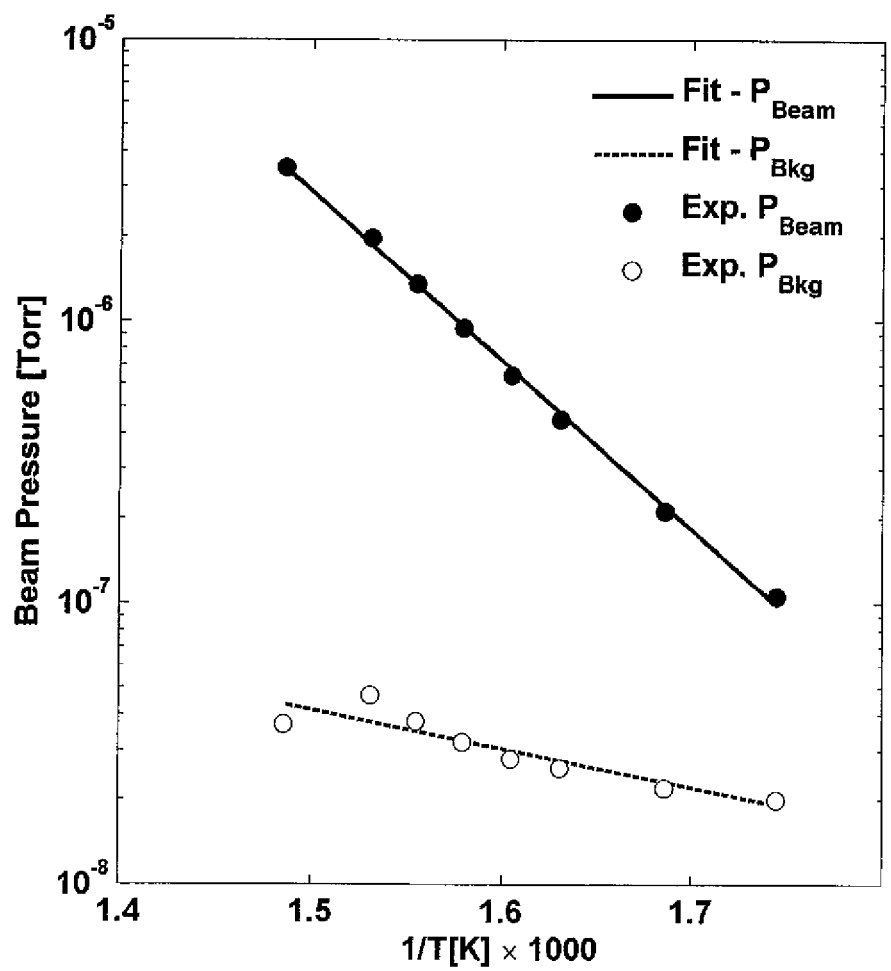
FIG. 7a shows beam equivalent pressure (BEP) of the $Zn_3P_2$ compound source effusion cell as a function of source temperature for a thermal treatment temperature of 1000° C.
Figure 7B:
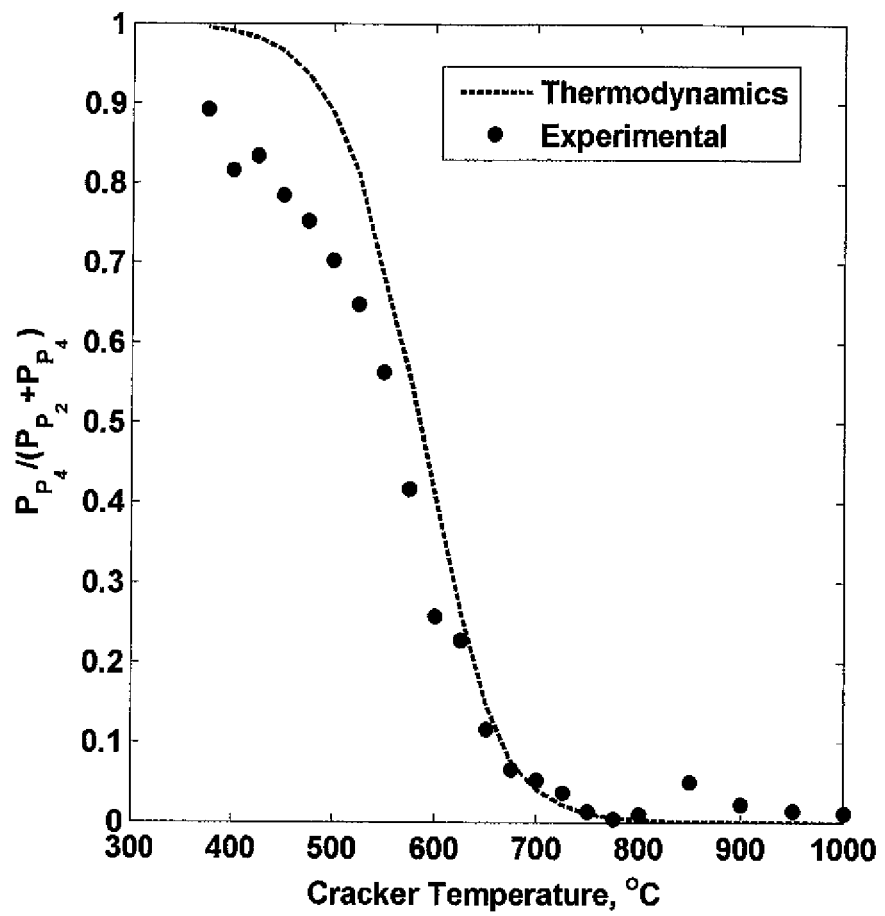
FIG. 7b shows the ratio of partial pressure of tetramer phosphorus species ($P_4$) to the sum of the partial pressures of dimer and tetramer phosphorus species ($P_2+P_4$) exiting the compound source effusion cell as a function of temperature within the second heating zone.

FIG. 7a shows beam equivalent pressure (BEP) of the $Zn_3P_2$ compound source effusion cell as a function of source temperature for a thermal treatment decomposition temperature of 1000° C. BEP was determined using a standard nude ionization gauge located within the effusion cell beam path and is uncorrected for ionization sensitivities of Zn and $P_2$ vapor species. Chamber background pressures (open circles) were found to be approximately 2 orders of magnitude lower than the $Zn_3P_2$ beam pressure at typical growth source temperatures (330-380° C.).

FIG. 7b shows the ratio of partial pressure of phosphorus tetramer species ($P_4$) to total phosphorus pressure ($P_2+P_4$) exiting the compound source effusion cell as a function of temperature within the thermal decomposition zone. The source temperature for sublimation of $Zn_3P_2$ was held at 350° C. and the chamber background pressure was less than $5\times10^{-8}$ Torr. Partial pressures of tetramer and dimer species were determined in situ using a quadrapole mass-spectrometer located within the effusion cell beam path. It is clear that thermal treatment causes conversion of $P_4$ to $P_2$ species beginning at approximately 400° C., with complete conversion occurring at temperatures above 750° C.

Generally, these figures show that thermal treatment causes conversion of $P_4$ to $P_2$ species beginning at approximately 400° C., with complete conversion occurring at temperatures above 750° C. The chamber background pressure was less than $5\times10^{-8}$ Torr during the entire experiment.

EXAMPLE 4

Growth of Stoichiometric $Zn_3P_2$ Thin Films

The growth of stoichiometric $Zn_3P_2$ is carried out using a similar procedure as Example 1, except that the temperature of the thermal decomposition/cracking region is adjusted between 400-800° C. to achieve a desired $P_4/P_2$ ratio in the flux. The $P_4/P_2$ ratio is measured in situ as described in Example 2. Following growth, the Zn:P ratio in the thin film is determined by EDS. If the atomic ratio of Zn:P is <1.5, then the temperature of the decomposition/cracker zone is reduced on a subsequent run. In contrast, if the atomic ratio of Zn:P is >1.5, then the temperature of the decompositon/cracker zone is increased on a subsequent run. These steps are repeated until a stoichiometric thin film of $Zn_3P_2$ is obtained. Once the initial evaluation of the cracker set point is determined, then film growth can be repeated as desired under the set conditions to achieve stoichiometric $Zn_3P_2$ thin films.

EXAMPLE 5

Growth of Zinc Phosphide Thin Films with Stoichiometry Other than $Zn_3P_2$

Growth is carried out in the same manner as Example 3, except that the $P_4/P_2$ ratio in the flux in the decomposition zone is adjusted via temperature selection so that the Zn:P ratio in the thin film is >1.5 or <1.5 as desired.

EXAMPLE 6

Growth of Zinc Sulfide Thin Film Useful as n-Type Material in Heterojunction of the Present Invention An undoped GaAs(001) single crystal wafer was glued to a molybdenum sample holder using indium-gallium eutectic and held in place using copper-beryllium clips. The indium-gallium-eutectic was used to facilitate heat conduction between the substrate and molybdenum holder. The substrate holder was then immediately placed under vacuum.

Within a molecular beam epitaxial growth chamber, the sample was first annealed at 350° C. for 1 hour to outgas any water or carbon contaminents. The substrate temperature was then raised at 10° C. per minute to 600° C. and held for 15 to 20 minutes. Finally, the substrate temperature was raised further at 2° C. per minute until the GaAs native oxide was thermally desorbed. Oxide desorption was monitored in situ using reflection high energy electron diffraction (RHEED). Once a satisfactory GaAs(001) surface reconstruction was observed in RHEED, the substrate temperature was quickly decreased to 350° C. at a rate of 20° C. per minute.

A standard knudsen effusion cell loaded with 99.9999% ZnS compound to be used as a ZnS source. ZnS beam pressures between 1.5 and $2.5\times10^{-6}$ Ton were used for growth, equivalent to source temperatures of 850° C. and 875° C. respectively. The source was heated at a rate of 15° C. per minute, during which time the substrate temperature was further decreased to the chosen growth temperature which was typically in the range of 50° C. to 350° C. Once the substrate temperature stablized at the chosen growth temperature, growth was initiated by opening both ZnS source and substrate shutters.

EXAMPLE 7

Growth of Al-Doped ZnS Thin Film Useful as n-Type Material in Heterojunction of the Present Invention Growth of Al-doped ZnS thin films was carried out in the same manner as Example 6, except that an electron beam evaporator was additionally used for vaporizing aluminum metal. The rate of evaporation was controlled manually by the e-beam power input. An additional e-beam shutter was also opened during growth to promote the foiivation of ZnS:Al. After 60 minutes, all shutters were closed and both substrate and source temperatures were decreased to room temperature. A film of 450 nm thickness (measured by profilometry) had a $3\times10^{18}$ electron carrier density and 55 $cm^2$/V-s carrier mobility.

EXAMPLE 8

Fabrication of a Heterojunction Solar Cell

An undoped GaAs(001) growth substrate is etched and loaded into a molecular beam epitaxial growth chamber in the same fashion as Example 1. Within the molecular beam epitaxial growth chamber, the substrate is annealed at 300° C. for 30 minutes to 1 hour to outgas any water or carbon contaminents followed by a higher temperature anneal at 450° C. to facilitate reconstruction of the GaAs surface. The substrate is allowed to cool to 200° C., and a Ag-doped $Zn_3P_2$ compound source (typically $1.0\times10^{17}/cm^3$-$5\times10^{18}/cm^3$) and Zn metal effusion cell are heated at rates of 12° C. per minute to 350° C. and 330° C. respectively. The $Zn_3P_2$ thermal decomposition/cracking region is heated to 1000° C. Growth is initiated by opening both source and substrate shutters. During growth the sample is rotated in plane at approximately 0.1 rotations per second (RPS). Growth is carried out for 330 minutes, to produce a $Zn_3P_2$:Ag film of approximately 2000 nm thickness. Following this growth time, all shutters are closed and both substrate and source temperatures are decreased to room temperature.

Without breaking vacuum, a ZnS:Al film is grown on the $Zn_3P_2$ layer using the same conditions as described in Example 7. Growth is carried out for about 7 minutes to produce a film of about 80 nm thickness. Following growth, the sample is removed from the molecular beam epitaxial chamber.

The GaAs/$Zn_3P_2$(Ag)/ZnS(Al) sample is transferred to a sputter chamber, wherein a 100 nm layer of aluminum doped zinc oxide (ZnO:Al) is deposited using a custom RF magnetron sputter chamber from 100 mm, (ZnO:Al) ceramic targets using gas flows of Ar (16.5 sccm) and $O_2$ (1.03 sccm). The total working gas pressure is about 2.5 mtorr and the substrate temperature is set to 150° C. during deposition. The sample is then transferred to an e-beam evaporator wherein, layers of Ni (100 nm) and Ag (1500 nm) are sequentially deposited through a mask on top of the ZnO:Al layer to produce a collection grid structure. The E-beam chamber pressure is reduced to $<2\times10^{-6}$ ton prior to deposition. All depositions are carried out at 9.0 kV, with current values of 0.130 and 0.042 A for Ni and Ag, respectively. Rates (Maxtek 260 quartz crystal monitor) are 2.0 Å/s and 15.0 Å/s for Ni and Ag, respectively. Ni shots (99.9999%, International Advanced Materials) are evaporated from a 7 cc graphite crucible, while Ag pellets (99.9999%, Alfa Aesar) are evaporated from a 7 cc Mo crucible.

EXAMPLE 9

Fabrication of a $Zn_3P_2$ Heterojunction Solar Cell

A p-type $Zn_3P_2$(Ag) layer is deposited on a GaAs substrate to a thickness of about 2000 nm as described in Example 8 except that following the formation of the $Zn_3P_2$(Ag) layer, without breaking vacuum, an n-type ZnS film is grown on the $Zn_3P_2$ layer using the same conditions as described in Example 6. Growth is carried out for about 7 minutes to produce a film of about 80 nm thickness. Following growth, the sample is removed from the molecular beam epitaxial chamber. The GaAs/$Zn_3P_2$(Ag)/ZnS sample is then transferred to a sputter chamber in which a 100 nm layer of aluminum doped zinc oxide (ZnO:Al), and Ni/Ag collection grid structure are deposited as described in Example 8.

EXAMPLE 10

Fabrication of a $Zn_3P_2$ Heterojunction Solar Cell

A p-type $Zn_3P_2$(Ag) layer is deposited on a GaAs substrate to a thickness of about 2000 nm as described in Example 8. The shutter is then closed on the Zn metal effusion cell and simultaneously opened on a Mg effusion cell to produce a $Zn_{3-x}Mg_xP_2$ layer with n-type characteristics. The GaAs/$Zn_3P_2$(Ag)/$Zn_{3-x}Mg_xP_2$ sample is then transferred to a sputter chamber in which a 100 nm layer of aluminum doped zinc oxide (ZnO:Al), and Ni/Ag collection grid structure are deposited as described in Example 8.

EXAMPLE 10

Extrinsic Doping of $Zn_3P_2$ Films

An extrinsically Ag doped p-type $Zn_3P_2$ film is produced in the same fashion as described in Example 1, with the exception that doping is accomplished during $Zn_3P_2$ thin film growth by use of conventional Knudsen-cell effusion source loaded with elemental Ag metal. The Ag source temperature is set in the range of 600-660° C. to achieve a dopant concentration in the $10^{17}$-$10^1 S/cm^3$ range. The dopant source temperature can be adjusted according to the $Zn_3P_2$ growth rate to produce a carrier concentration in the abovementioned range.

EXAMPLE 12

Fabrication of a $Zn_3P_2$ Homojunction Solar Cell

A p-type $Zn_3P_2$(Ag) layer is deposited on a GaAs substrate to a thickness of about 2000 nm as described in Example 11. Without breaking vacuum, the shutter is closed on the Ag effusion cell and a Zn-rich n-type zinc phosphide layer is grown to about 100 nm thick by increasing the temperature on the Zn effusion cell. The GaAs/$Zn_3P_2$(Ag)/$Zn_{3+x}P_2$ sample is then transferred to a sputter chamber in which a 100 nm layer of aluminum doped zinc oxide (ZnO:Al), and Ni/Ag collection grid structure are deposited as described in Example 8.

What is claimed is:

1. A method of forming a Group IIB/VA pnictide composition, comprising the steps of:
    a) providing at least one Group IIB/VA pnictide source compound, said pnictide source compound incorporating at least one pnictogen and at least one Group IIB element other than a pnictogen;
    b) treating the Group IIB/VA pnictide source compound under first conditions in a first processing zone in a manner effective to create a vapor flux comprising a vapor species, the vapor flux derived at least in part from the Group IIB/VA pnictide source compound and comprising $P_N^2$ and $P_N^4$ molecular pnictogen species having a first mole fraction of $P_N^2$ relative to $P_N^4$;
    c) treating the vapor flux under second conditions in a second processing zone in a manner effective to provide a modified vapor flux comprising $P_N^2$ and $P_N^4$ molecular pnictogen species having a second mole fraction of $P_N^2$ relative to $P_N^4$; and
    d) using ingredients including at least the treated vapor flux to form the Group IIB/VA pnictide composition.

2. The method of claim 1, wherein the pnictide source compound comprises zinc and phosphorus.

3. The method of claim 1, wherein the molecular pnictogen species comprises phosphorus.

4. The method of claim 1, wherein step (b) comprises heating the pnictide source compound at one or more temperatures in the range from 150° C. to 450° C.

5. The method of claim 1, wherein step (c) comprises heating the $th_e$ vapor flux at a temperature that is at least 100° C. higher than the temperature used in step (b).

6. The method of claim 1, wherein step (c) comprises heating the vapor flux at one or more temperatures in the range from 300° C. to 1200° C.

7. The method of claim 1, wherein step (c) is carried out under conditions effective to form a film having a stoichiometric excess of pnictogen.

8. The method of claim 1, wherein step (c) is carried out under conditions effective to form a film having a stoichiometric deficiency of pnictogen.

9. The method of claim 1, wherein a first portion of the formed pnictide composition has p type characteristics and a second portion of the formed pnictide composition has n type characteristics.

10. The method of claim 1, further comprising the step of annealing at least a portion of the formed pnictide composition.

11. The method of claim 1, wherein the formed pnictide composition is a film and is photovoltaically active.

12. The method of claim 1, further comprising the step of incorporating the formed pnictide composition into a photovoltaic device.

13. The method of claim 12, wherein the pnictide composition forms at least a portion of a p-n junction.

14. The method of claim 1, wherein the pnictide composition is included in a film that overlies a p-n junction.

15. The method of claim 14, wherein the film comprises (a) a pnictogen and at least one other element, wherein the pnictogen and at least one other element are derived from the pnictide source compound; and (b) at least one additional element derived from a second source, and wherein the at least one other element comprises Mg.

16. The method of claim 1, wherein the pnictide source compound includes at least two pnictogens.

17. The method of claim 1, wherein the composition of the at least partially decomposed flux from step (c) is monitored in a manner such that the pnictide composition is controlled by appropriate adjustment of the second conditions during growth of the pnictide composition.

18. An apparatus suitable to form a pnictogen-containing semiconductor, comprising
   a) a first heating zone in which a Group IIB/GroupVA pnictide source compound is positioned and heatable under conditions effective to generate a vapor flux derived at least in part from the source compound;
   b) a vapor flux pathway extending from the first heating zone to a substrate surface on which the vapor flux is deposited under conditions effective to form the semiconductor, said vapor flux pathway including the vapor flux from the first heating zone and a second, independent vapor decompositional heating zone in which the vapor flux from the first heating zone is at least partially decomposed into species comprising $P_N^2$ and $P_N^4$ molecular pnictogen species; and
   (c) a process control that uses a sensed temperature of the vapor flux to achieve and maintain a desired film composition.

19. The method of claim 1, wherein step (c) comprises using information that correlates decomposition temperatures of the vapor flux to corresponding composition of the Group IIB/VA pnictide composition to select a temperature to modify the vapor flux.

20. The apparatus of claim 18, wherein the process control comprises information that correlates decomposition temperatures of the vapor flux to corresponding compositions of the pnictogen-containing semiconductor, a temperature sensor to sense temperature of the vapor flux, and a sensed temperature obtained from the temperature sensor, wherein the process control uses the information and the sensed temperature to achieve and maintain a desired film composition.

* * * * *